(12) United States Patent
Pielmeier

(10) Patent No.: US 6,334,202 B1
(45) Date of Patent: Dec. 25, 2001

(54) FAST METRIC CALCULATION FOR VITERBI DECODER IMPLEMENTATION

(75) Inventor: Stefan Pielmeier, Bamberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/120,203

(22) Filed: Jul. 22, 1998

(51) Int. Cl.$^7$ ................................................. H03M 13/03
(52) U.S. Cl. ..................... 714/795; 714/794; 714/796; 708/550
(58) Field of Search ..................... 714/794–796, 714/797, 792; 707/6, 7; 708/525, 550; 712/221; 375/220, 262, 265, 341, 345; 340/825.56; 455/226.2, 67.1

(56) References Cited

U.S. PATENT DOCUMENTS

| | | | |
|---|---|---|---|
| 5,524,027 | * 6/1996 | Huisken | 375/341 |
| 5,537,444 | * 7/1996 | Nill et al. | 375/341 |
| 5,687,188 | * 11/1997 | Feeney et al. | 375/220 |
| 5,727,029 | 3/1998 | Jeon et al. | 375/341 |
| 5,835,960 | * 11/1998 | Keene et al. | 711/172 |
| 5,862,190 | * 1/1999 | Schaffner | 375/341 |
| 5,907,842 | * 5/1999 | Mennemeier et al. | 707/7 |
| 6,023,783 | * 2/2000 | Divsalar et al. | 714/792 |
| 6,065,093 | * 5/2000 | Dell et al. | 711/105 |
| 6,172,626 | * 1/2001 | McDonnell et al. | 341/67 |

FOREIGN PATENT DOCUMENTS 2 311 447   9/1997   (GB) .

OTHER PUBLICATIONS

Heller et al., "Viterbi Decoding for Satellite and Space Communication," IEEE Transactions on Communication Technology, vol. COM–19, No. 5, Oct. 1971, pp. 835–845.
Forney Jr., "The Viterbi Algorithm," Proceedings of the IEEE, vol. 61, Mar. 1973, pp. 268–278.
Baum, et al.(Subpotimal Viterbi Decoding Metrics for Channels With Pulse Jamming. IEEE, 1996).*
Zhian, et al.(An Extremely Robust Turbo Coded HF Modem. IEEE, 1996).*

\* cited by examiner

*Primary Examiner*—Phung M. Chung
*Assistant Examiner*—Guy J. Lamarre
(74) *Attorney, Agent, or Firm*—Burns, Doane, Swecker & Mathis, L.L.P.

(57) ABSTRACT

A method and apparatus are used for determining a metric in a decoding algorithm, such as a Viterbi algorithm, using an n-bit processing module, on the basis of plural m-bit soft input words, wherein $n \geq 2 \times m$. The technique comprises: receiving plural m-bit soft input words; assembling at least two of the plural m-bit soft input words into a single n-bit composite soft input word; computing the respective distances between the at least two soft input words in the composite soft input word and expected codeword values to produce a composite distance word; summing the respective distances together to produce the metric; and extracting the metric. The n-bit processing module may comprise a 16-bit processing module employing 16-bit words, and the m-bit soft input words may each comprise a 4-bit word. Processing the plural soft input words en bloc increases the speed and information transfer rate of the decoder, and reduces the memory requirements of the decoder.

24 Claims, 5 Drawing Sheets

| Input | Distance to expected 1 | Distance to expected 0 |
|-------|------------------------|------------------------|
| 0000  | 1111                   | 0000                   |
| 0001  | 1110                   | 0001                   |
| 0010  | 1101                   | 0010                   |
| ...   | ...                    | ...                    |
| 1110  | 0001                   | 1110                   |
| 1111  | 0000                   | 1111                   |

```
     15                                    0
    ┌────────┬───┬────────┬───┬────────┐
    │r2(4bit)│0 0│r1(4bit)│0 0│r0(4bit)│    ISW
    └────────┴───┴────────┴───┴────────┘
```

```
     15                                    0
    ┌────────┬───┬────────┬───┬────────┐
    │CW[2]*  │0 0│ CW[1]  │0 0│ CW[0]  │    CWM
    └────────┴───┴────────┴───┴────────┘
```

```
     15                                    0
    ┌────────┬───┬────────┬───┬────────┐
    │  d2*   │0 0│   d1   │0 0│   d0   │    DW
    └────────┴───┴────────┴───┴────────┘
```

FAST METRIC CALCULATION FOR VITERBI DECODER IMPLEMENTATION

BACKGROUND

1. Field of the Invention

This invention relates to an apparatus and method for efficiently calculating metrical distances in a Viterbi soft decoder in a communication system, such as a wideband CDMA system in which Viterbi decoding in a base station is used to decode convolutional coded information which is transferred from mobile stations.

2. Discussion of Related Art

The Viterbi algorithm is a well known technique for decoding convolutional codes in communication systems. FIG. 1 provides an overview of the application of this algorithm in a communications system. As shown there, an input sequence is transformed into a codeword sequence using convolutional encoder 10. This encoder 10 accepts k-bit blocks of the input sequence and produces a codeword sequence of n-symbol blocks at the same time unit. The ratio R of k/n is referred to as the code rate. For instance, in wideband CDMA, two code rates R=1/2 and R=1/3 are typically used. As is well understood in the art, the encoder may be implemented using a shift register, modulo-2 adders and a multiplexer.

The codeword sequence is then modulated by modulator 20 (e.g., using phase, frequency or amplitude modulation), and then transmitted on a communication channel 30. The channel 30 is subject to noise 40, such as additive white Gaussian noise (AWGN), causing possible corruption of the transmitted information. The demodulator 50 receives the transmitted information and produces an output r, which may be a discrete (quantized) signal. A hard-decision demodulator makes a firm decision whether a 0 or 1 was transmitted. Alternatively, a soft-decision demodulator demodulates the received information and also provides additional information regarding the confidence level of the demodulated information. This supplements the information provided to the decoder 60, and thereby improves the performance of the decoder 60.

The decoder 60 and associated memory 70 implement the Viterbi algorithm. The algorithm itself may be described as a recursive optimal solution to the problem of estimating the state sequence of a discrete-time finite-state Markov process observed in memoryless noise. See, for instance, Forney, "The Viterbi Algorithm," Proc. IEEE, Vol. 6, March 1973, pp. 268–278. The algorithm finds the shortest path through a trellis given a set of observations. The trellis is a time-indexed state diagram, with each node corresponding to a state at a given discrete time. The lines connecting the nodes in the trellis are called branches, which correspond to transitions from one state to another.

Costs are assigned to the branches connecting the nodes in the trellis. These costs, or metrics, are given by a negative log likelihood function, which is approximated by $\|z-y\|^2$, where z is a signal representative of observed outputs and y is a signal representative of actual outputs for a transition between states. Furthermore, noisy outputs may be quantized into three or four bits, and the branch metrics may be approximated by an absolute difference measure. Note Heller et al., "Viterbi decoding for Satellite and Space Communications," IEEE Trans. Communication Technology, Vol. CPMM-19, No. 5, October 1971, pp. 835–848. More specifically, the log likelihood function used to determine the metrics can be reduced to a minimum distance measure, such as the Hamming distance. The Hamming distance provides a measure of the number of bits that are different between the symbol that the algorithm observes and the symbol that the encoder should have produced had it followed a given input sequence.

A portion of the trellis for Viterbi decoding is shown in FIG. 2 for illustration purposes. The two nodes at the left represent two states at a time t, while the two nodes at the right represent two states at a time t+1. As shown there, there are two paths which lead to state 0 at time t+1, e.g., a first path which connects state 0 at time t to state 0 at time t+1, and a second path which connects state 1 at time t to state 0 at time t+1. The paths are associated with codewords of the convolutional encoder. Also, both paths have a metric (or path length) associated therewith, e.g., pd0 and pd1, respectively.

The actual Viterbi algorithm involves recursively performing an add-compare-select procedure, as best understood with reference to FIG. 3. In the add operation, an accumulated metric m0 associated with state 0 at time t is added (using adder 80) to the metric pd0 associated with the transition from state 0 at time t to state 0 at time t+1. The accumulated metric m1 associated with state 1 at time t is added (using adder 90) to the metric pd1 associated with the transition from state 1 at time t to state 0 at time t+1. The compare module 100 determines whether the output of adder 80 is greater than the output of adder 90, or vice versa, and the selector 110 selects the smaller accumulated metric. Also, this add-compare-select module outputs an indication of the input path which yielded the smallest accumulated metric.

This procedure is repeated for all states in each trellis step (not shown). Further, the output of the trellis step shown is used as an input for a subsequent trellis step (not shown). For any time t, there are M survivor paths (e.g., paths that are retained for the next trellis stage). When state sequences are very long, it may be necessary to truncate survivors to some manageable length $\delta$, as described in the above-referenced Forney paper. By recursively selecting the shortest paths, the algorithm reconstructs the most likely path through the trellis, which should correspond to the actual transmitted sequence before the signal was corrupted by the noise.

In actual practice, when implementing Viterbi soft decoding, soft input values may be used which comprise 4-bit words. This is because 4 bits are enough to improve the decoder performance by approximately 2 dB in SNR in comparison with hard decision Viterbi decoding. For instance, for a convolutional code rate R=1/3, three soft input words of 4 bits each represent one information bit. The three input words are denoted by r0, r1 and r2.

With reference to FIG. 2, the metric pd0 for the 3-word soft input example described above is pd0=d(r0; 0)+d(r1; 0)+d(r2;0), and the metric pd1=d(r0; 1)+d(r1; 1)+d(r2; 1). The individual operands in these two equations represent the distance between a soft input 4-bit word and two possible codewords. Each codeword relates to a path in the trellis diagram relating to a state out of $2^L$, where L is the constraint length of the code (e.g., here L=9).

The known state of the art is to perform the distance calculations d(r0,1), d(r1,1), d(r2, 1), etc., separately. Further, it is known to perform these computations on 16-bit hardware, such as a signal processor which employs 16-bit arithmetic. This means that, for every calculation using a 4-bit operand, there is a significant portion of the 16-bit digital processor word which is not used, and hence "wasted." This inefficient use of the 16-bit hardware negatively affects the performance of the decoder because the decoder is not fully exploiting its resources.

One known solution to improve the speed of the algorithm is to perform certain parts of the algorithm in parallel using plural digital signal processing cores. This, however, has the negative consequence of requiring additional hardware, while still not making efficient use of the hardware that is employed.

Accordingly, it is one objective of the present invention to more efficiently employ 16-bit hardware to perform Viterbi processing so as to improve the speed and resource utilization of the Viterbi decoder.

SUMMARY

These and other objectives of the present invention are achieved by packing (i.e., assembling) plural soft input words into an n-bit composite soft input word, and processing this composite soft input word en bloc.

More specifically, the invention pertains to a method and apparatus for determining a metric in a decoding algorithm, such as a Viterbi algorithm, using an n-bit processing module, on the basis of plural m-bit soft input words, wherein n≧2×m. The technique comprises: receiving plural m-bit soft input words; packing at least two of the plural m-bit soft input words into a single n-bit composite soft input word; computing the respective distances between the at least two soft input words in the composite soft input word and expected codeword values to produce a composite distance word; summing the respective distances together to produce the metric; and extracting the metric. The n-bit processing module may comprise a 16-bit processing module employing 16-bit words, and the m-bit soft input words each may comprise a 4-bit word. Processing the plural soft input words en bloc increases the speed and information transfer rate of the decoder, and reduces the memory requirements of the decoder.

According to one exemplary embodiment, the decoder may decode information which has been convolutionally coded at a rate of R=1/3, in which case three 4-bit words are packed into a 16-bit word, with two-bit separators located between the words. Alternatively, the decoder may decode information which has been convolutionally coded at a rate of R=1/2, in which case two 4-bit words are packed into a 16-bit word with a two-bit separator located between the words.

The step of computing comprises the substeps of: retrieving an n-bit codeword mask word from memory, the codeword mask including fields providing the expected codeword values associated with the respective soft input words; and XORing the codeword mask word with the composite soft input word.

The step of summing comprises the substep of multiplying the composite distance word by an extraction word to produce a product word. The step of extracting comprises the substep of extracting the metric from a subfield of the product word. For the embodiment in which at least two soft input words are packed in a 16-bit word with a 2-bit separator between adjacent soft input words, the extraction word is: 0001000001000001.

BRIEF DESCRIPTION OF THE DRAWINGS

The present invention will now be described with reference to the following drawing figures, in which.

DETAILED DESCRIPTION

Within a soft decision Viterbi decoder, a distance calculation between the path codeword and the K real soft input values $y_i$ is made by applying the following formula for each path:

$$\sum_{i=1}^{K} (y_i x_i),$$

where $x_i$ represents the assumed bit according to the calculated trellis transition between two states. Further, $x_i$ represents an element of $\{-1,1\}$ and just negates the soft input value $y_i$ (for $x_i=-1$), or leaves the value of the soft input intact (for $x_i=1$). K is the number of code bits per information bit.

Figures 4, 5:
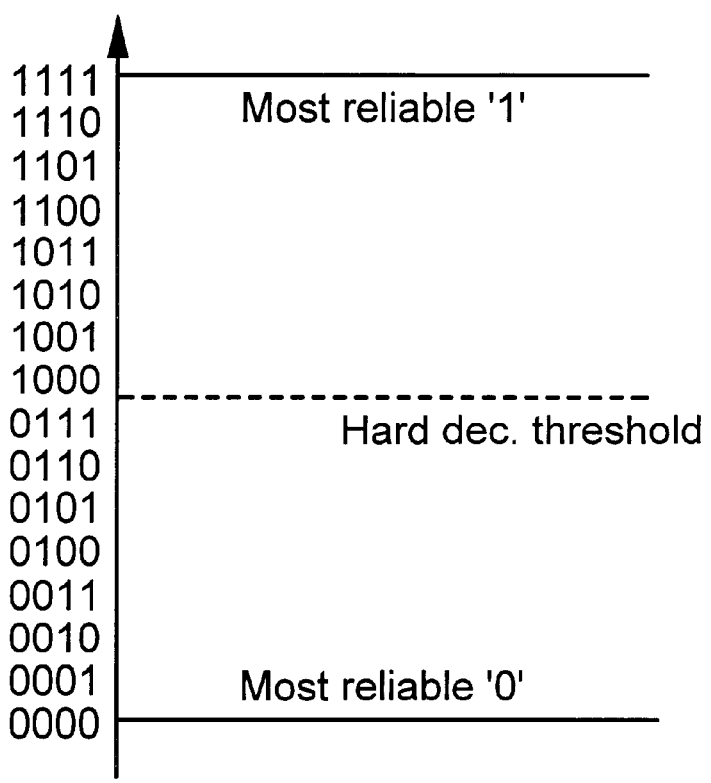
FIG. 4 shows how the distance between a soft input 4-bit word and an expected codeword value is determined.
FIG. 5 shows the reliability of a soft input 4-bit word as a function of its individual bit values.

To calculate the distance between the received soft word $r_n$ and the expected codeword bit, the soft input word values are treated as shown in FIG. 4 in accordance with the above-stated formula. As indicated there, the distance d between an expected '0' and a soft input word is simply the integer value of the word. If a '1' is expected, the bit inverse of the soft input word represents the distance d. As indicated in FIG. 5, large distance values correspond to large distances to the expected value. Therefore, the expected value is less reliable. Small distances values correspond to a high reliability for the expected value. The distances between r0, r1 and r2 and an expected value (e.g., 0 or 1) are referred to as d0, d1 and d2, respectively.

FIGS. 6–9 show how the distances d0, d1 and d2 can be computed using 16-bit arithmetic hardware in a non-recursive fashion. More specifically, with reference to FIG. 6, for R=1/3, the three soft input words are stored within one 16-bit word (ISW) with a separator of 2 zero bits between each word. This operation is referred to as "assembling" or "packing" herein. When R=1/2, the r2 soft input word is set to zero, e.g., r2='0000.'

Figures 6, 7, 8, 9:
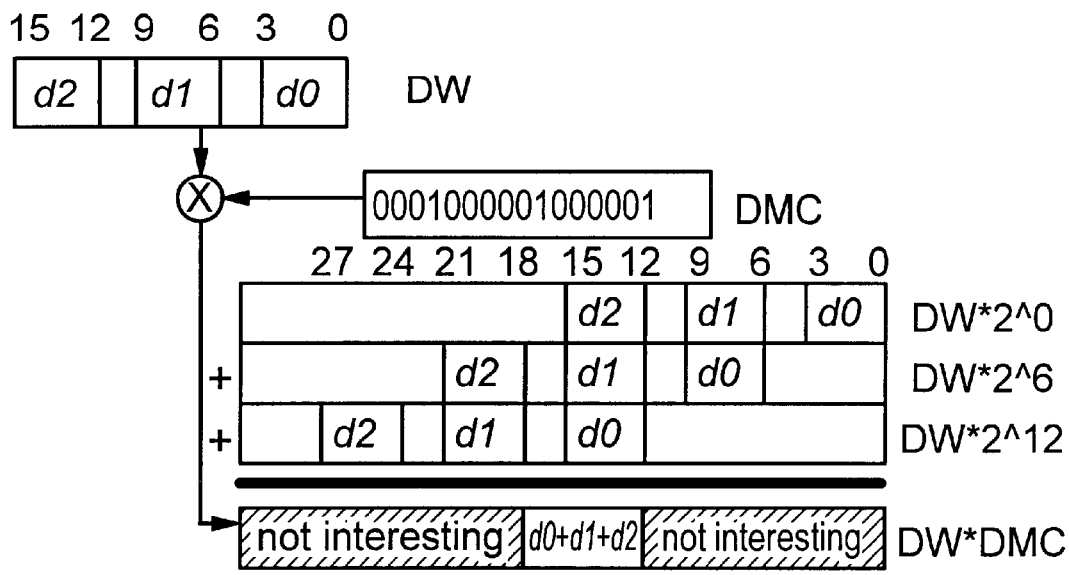
FIG. 6 shows a soft composite word (ISW) including three 4-bit soft input words contained therein.
FIG. 7 shows a composite codeword masking word (CWM)
FIG. 8 shows a composite distance word (DW) produced by XORing the ISW word and the CWM word.
FIG. 9 shows the manner of adding the individual fields in the DW word together using a multiplying operation.

As shown in FIG. 7, the expected value information is represented by a bit mask codeword, referred to as CWM (codeword mask). Each field in the CWM is 4-bits long, again separated by the separator bits (which comprise two adjacent '0' bits). All bits 0–3 are set to the same value to match the CW[0] bit; that is, if the expected value is '0', bits 0–3 are all set to zero. The same holds true for bits 6–9 and 12–15, which are all set to the value of CW[1] and CW[2], respectively. However, if the code rate R=1/2, then bits 12–15 are all set to '0' by default.

Considering the source of the codeword mask, it may be preferable to generate this mask once for all different states to spare the calculation "state-number-to-codeword," which is very time consuming on the digital signal processor. Thus, the CWM may be loaded from the internal data memory with the state number as offset. For the disclosed method, only one load instruction is needed to get the 16-bit CWM from memory. Conventionally, this required three load instructions.

To compute the distances, the CWM word is XORed with the ISW word. One XOR operation is enough to modify the three soft input words by leaving them untouched if CW[n]=0 and inverting them bitwise if the assumed codeword is CW[n]=1. The resultant distance word DW is shown in FIG. 8. As indicated, this word has the distances d0, d1 and d2 embedded therein, separated by the 2-bit '0' separator buffers.

To add these distances together, the DW is multiplied by the distance multiplication codeword $DMC=2^{12}+2^6+2^0=$ 0001000001000001, also referred to herein as an "extraction word." This is illustrated in FIG. 9. As indicated there, this multiplication has the effect of producing the sum pd=d0+d1+d2 in bits 12 to 17 in the multiplication result. Therefore, for two additions, only one instruction is necessary, whereas some conventional systems require two instructions (that is, some adders have only two inputs, thus requiring at least two instructions to perform an operation involving more than two operands). Finally, this sum pd can be extracted from the multiplication result to a register with an extract (EXT) command.

Figure 10:
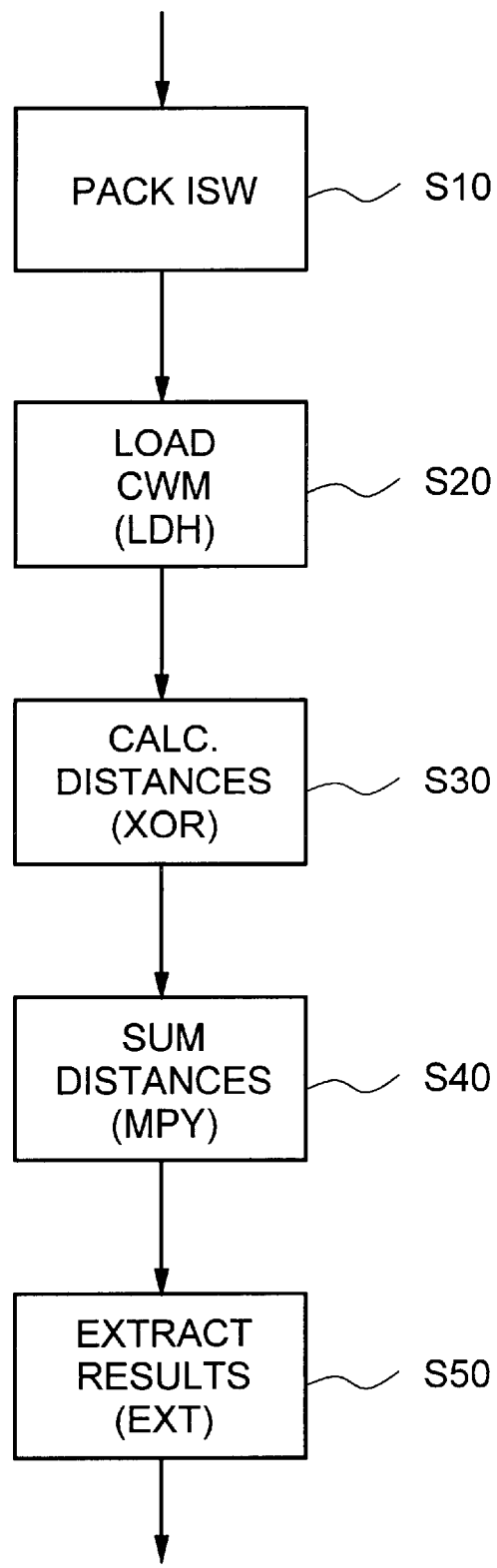
FIG. 10 shows an algorithm for computing metrics according to exemplary embodiments of the present invention.

FIG. 10 provides a summary of the above-described technique in flowchart form. In step S10, the 16-bit word is packed with either three or two soft input words (for 1/3 and 1/2 code rates, respectively). Then, the CWM word is loaded from memory in step S20. Following loading, the CWM word is XORed with the ISW word in step S30, followed by the summation of the distances via the multiplying operation in step S40. Finally, the sum (describing the probability for a transition in the trellis from one state to another) is extracted in step S50.

The advantage of the above-described technique is that only 4 operations are used once the ISW word is created (e.g., the loading, XORing, multiplying and extracting steps). Conventionally, 8 operations are necessary to produce the same result, e.g., three operations for loading the soft input words, three operations for calculating the distances, and two operations for adding the distances. In other words, four instructions can be saved when using the method of the present invention. As mentioned above, a further two instructions can be saved by loading CWM from memory.

The cost of the 6 spared instructions is the step of organizing the 3 input words in the 16-bit input word (step S10). But using this method, the 4-bit values are packed better. The smallest input word size for general purpose digital signal processors is 8-bit. Therefore, the conventional approach described in the BACKGROUND wastes at least 4 bits per input value; with the proposed method, only 4 bits per 3 soft input values (each having 4 bits) are unused.

Due to this grouping of the words r0, r1 and r2, a dual ported RAM which interfaces to the preceding receiver part can have a size of only 67% of a RAM (e.g., memory 70) used in a conventional solution. Further, when using a serial connection, the data transfer rate decreases from 8 bits/value to 5.3 bits/value, which is notably more efficient than the conventional transfer technique.

More specifically, exemplary advantages of the present invention may be summarized as follows. The number of instructions can be reduced to 5/11=45% of the number of instructions used in some conventional decoders. The RAM for storing soft input values and codeword masks (CWM) can be reduced to (16/3)/(8*3/3)=67% of the RAM storage used in some conventional decoders. Similarly, the data transfer rate from a preceding unit can be reduced to (16/3)/(8*3/3)=67% of the data transfer rate of some conventional decoders.

The present invention has been described in the context of an exemplary embodiment of Viterbi decoding of convolutional coded data with code rates of R=1/2 or 1/3. The invention, however, is not limited as such.

This technique finds application with other code rates, and in other types of decoding algorithms (e.g., other MLSE algorithms).

One application of this technique is for use in wideband CDMA systems. For instance, the invention can be used in a base station to decode the convolutional coded information which is transferred from the mobile stations via CDMA modulation. The invention can also be used in the mobile stations. However, the invention can be used in other transmission protocols, and even finds use in non-communication applications (e.g., in the storage and retrieval of information from a storage medium).

Figure 1:
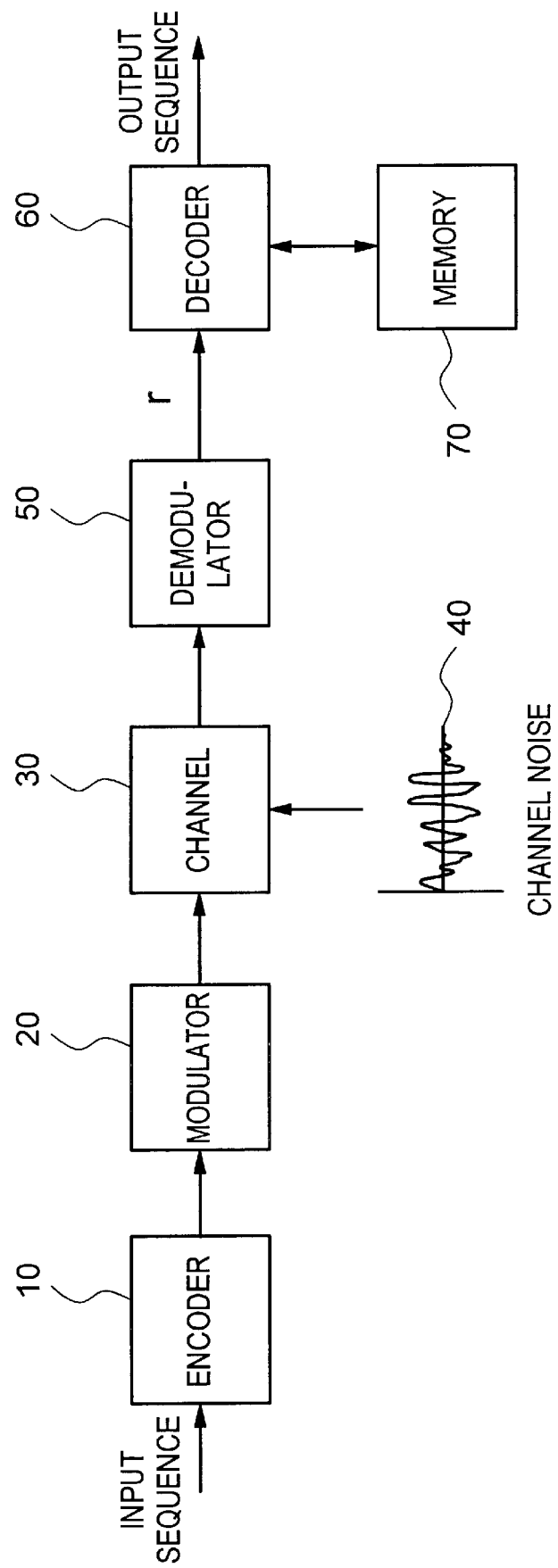
FIG. 1 shows an overview of a conventional communication system using a Viterbi decoder.
Figure 2:
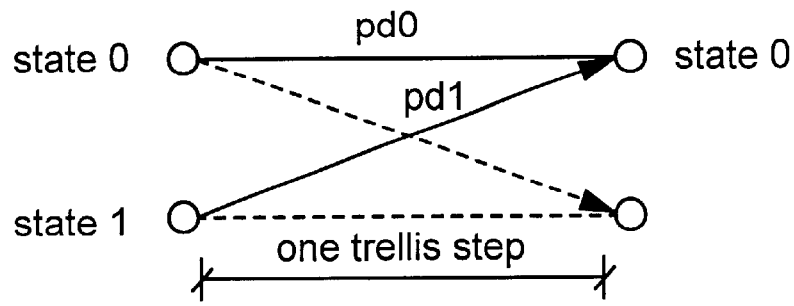
FIG. 2 shows a portion of a trellis diagram.
Figure 3:
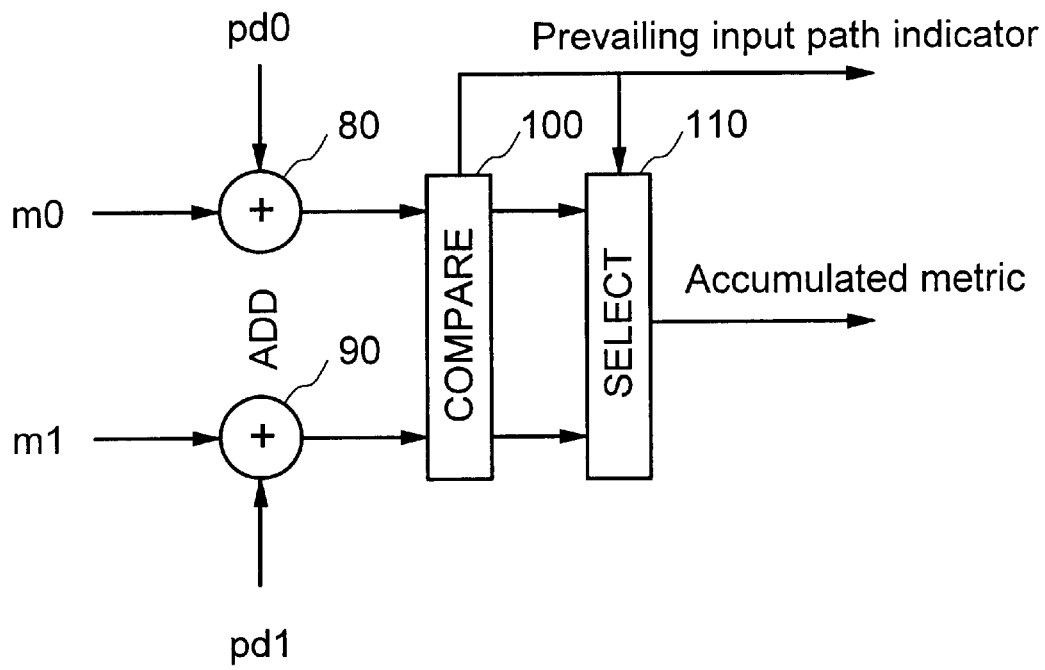
FIG. 3 shows a conventional add-compare-select module used in the Viterbi decoder.

The present invention can be implemented on the basic system configuration shown in FIG. 1, with suitable programming changes made to the decoder 60 so as to carry out the algorithm shown in FIG. 10. The logic to carry out the algorithm shown in FIG. 10 can comprise a series of microinstructions stored in the decoder 60. Alternatively, the decoder 60 used to carry out the algorithm in FIG. 10 can employ discrete logic components.

The decoder 60 can be implemented on any 16-bit arithmetic processor, such as the TMS320C6201 processor made by Texas Instruments, and the memory 70 can comprise the above-described dual port RAM memory. Generally, however, the invention finds use with any decoder having n-bit arithmetic, where n≧2×m, where m is the bit length of a soft input word. That is, the soft word packing technique can also be used in other types of processors which do not utilize 16-bit architecture, so long as the word length of the processor is long enough to accommodate at least two soft input words.

Further modifications and improvements which retain the basic underlying principles disclosed and claimed herein are within the scope and spirit of the present invention.

What is claimed is:

1. A method for determining a metric in a decoding algorithm using an n-bit processing module, on the basis of plural m-bit soft input words, wherein n≧2×m, the method comprising the steps of:

receiving said plural m-bit soft input words;

packing at least two of said plural m-bit soft input words into a single n-bit composite soft input word;

computing the respective distances between the at least two soft input words in the composite soft input word and expected codeword values, to produce a composite distance word;

summing the respective distances together to produce the metric; and extracting the metric.

2. The method of claim 1, wherein said decoding algorithm is a Viterbi algorithm.

3. The method of claim 1, wherein said n-bit processing module comprises a 16-bit processing module employing 16-bit words.

4. The method of claim 3, wherein said m-bit soft input words each comprise a 4-bit word.

5. The method of claim 4, wherein said decoding algorithm decodes information which has been convolutionally coded at a rate of R=1/3, and three 4-bit words are packed into a 16-bit word.

6. The method of claim 4, wherein said decoding algorithm decodes information which has been convolutionally coded at a rate of R=1/2, and two 4-bit words are packed into a 16-bit word.

7. The method of claim 4, wherein separator-bits are inserted between soft input words packed within a 16-bit word.

8. The method of claim 7, wherein the separator bits comprise two adjacent bits.

9. The method of claim 1, wherein said step of computing comprises the substeps of:

retrieving an n-bit codeword mask word from memory, said codeword mask word including fields providing the expected codeword values associated with said respective at least two soft input words; and XORing the codeword mask word with the composite soft input word.

10. The method of claim 1, wherein said step of summing comprises the substep of multiplying the composite distance word by an extraction word to produce a product word.

11. The method of claim 10, wherein said step of extracting comprises the substep of extracting said metric from a subfield of the product word.

12. The method of claim 10, wherein at least two soft input words are packed within a 16-bit word with a 2-bit separator between adjacent soft input words, and wherein said extraction word is: 0001000001000001.

13. An apparatus for determining a metric in a decoding algorithm using an n-bit processing module, on the basis of plural m-bit soft input words, wherein n≧2×m, the apparatus comprising:

logic for receiving said plural m-bit soft input words;

logic for packing at least two of said plural m-bit soft input words into a single n-bit composite soft input word;

logic for computing the respective distances between the at least two soft input words in the composite soft input word and expected codeword values to produce a composite distance word;

logic for summing the respective distances together to produce the metric; and logic for extracting the metric.

14. The apparatus of claim 13, wherein said decoding algorithm is a Viterbi algorithm.

15. The apparatus of claim 13, wherein said n-bit processing module comprises a 16-bit processing module employing 16-bit words.

16. The apparatus of claim 15, wherein said m-bit soft input words each comprise a 4-bit word.

17. The apparatus of claim 16, wherein said decoding algorithm decodes information which has been convolutionally coded at a rate of R=1/3, and three 4-bit words are packed into a 16-bit word.

18. The apparatus of claim 16, wherein said decoding algorithm decodes information which has been convolutionally coded at a rate of R=1/2, and two 4-bit words are packed into a 16-bit word.

19. The apparatus of claim 16, wherein separator bits are inserted between soft input words packed within a 16-bit word.

20. The apparatus of claim 19, wherein the separator bits comprise two adjacent bits.

21. The apparatus of claim 13, wherein said logic for computing comprises sublogic for:

retrieving an n-bit codeword mask word from memory, said codeword mask including fields providing the expected codeword values associated with said respective at least two soft input words; and XORing the codeword mask word with the composite soft input word.

22. The apparatus of claim 13, wherein said logic of summing comprises sublogic for multiplying the composite distance word by an extraction word to produce a product word.

23. The apparatus of claim 22, wherein said logic for extracting comprises sublogic for extracting said metric from a subfield of the product word.

24. The apparatus of claim 22, wherein at least two soft input words are packed within a 16-bit word with a 2-bit separator between adjacent soft input words, and wherein said extraction word is: 0001000001000001.

* * * * *